(12) United States Patent
Kawakami et al.

(10) Patent No.: US 9,053,798 B2
(45) Date of Patent: Jun. 9, 2015

(54) NON-VOLATILE MEMORY CIRCUIT

(71) Applicant: SEIKO INSTRUMENTS INC., Chiba (JP)

(72) Inventors: Ayako Kawakami, Chiba (JP); Kazuhiro Tsumura, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 6 days.

(21) Appl. No.: 14/097,298

(22) Filed: Dec. 5, 2013

(65) Prior Publication Data

US 2014/0160860 A1 Jun. 12, 2014

(30) Foreign Application Priority Data

Dec. 10, 2012 (JP) .................. 2012-269761

(51) Int. Cl.
*G11C 11/34* (2006.01)
*G11C 16/12* (2006.01)
*G11C 16/04* (2006.01)

(52) U.S. Cl.
CPC ............ *G11C 16/12* (2013.01); *G11C 16/0408* (2013.01)

(58) Field of Classification Search
CPC ..................................................... G11C 29/028
USPC ........................................ 365/185.01–185.33
See application file for complete search history.

(56) References Cited

U.S. PATENT DOCUMENTS

| 6,055,186 | A | * | 4/2000 | Hung et al. | ............... 365/185.18 |
| 6,097,628 | A | * | 8/2000 | Rolandi | ................... 365/185.03 |
| 6,643,176 | B1 | * | 11/2003 | Fan et al. | ................... 365/185.2 |

FOREIGN PATENT DOCUMENTS

| JP | 05055605 | 3/1993 |
| JP | 2001257324 | 9/2001 |

* cited by examiner

*Primary Examiner* — Alexander Sofocleous
*Assistant Examiner* — Muhammad Islam
(74) *Attorney, Agent, or Firm* — Adams & Wilks

(57) ABSTRACT

A non-volatile memory circuit is formed of a P-channel MOS transistor and includes a P-channel non-volatile memory element having a floating gate and a control gate capacitively coupled together. A resistor divider has a first resistor and a second resistor for dividing a voltage difference between a power supply voltage and a ground voltage. A divided voltage output of the resistor divider is connected to the control gate. First and second switches are connected in parallel to the respective first and second resistors. The first and second switches are controlled so that a voltage of the control gate is set to a voltage of the divided voltage output which maximizes an electric field between a pinch-off point and a drain point of the P-channel MOS transistor in a writing mode.

9 Claims, 3 Drawing Sheets

FIG. 2

|  | Write | Read | Retention |
|---|---|---|---|
| V5 | High | Low | Low |
| V6 | Low | Low | Low |
| Vcg | $\dfrac{Vdd \times R2}{R1+R2}$ | Vdd | Vdd |
| Vfg | Vcg × CR | Vcg × CR | Vcg × CR |

NON-VOLATILE MEMORY CIRCUIT

BACKGROUND OF THE INVENTION

1. Field of the Invention

The present invention relates to a non-volatile memory circuit capable of electrical writing and reading.

2. Description of the Related Art

There is known a semiconductor integrated circuit including a bleeder resistor circuit capable of being trimmed by a memory. Hitherto, the bleeder resistance is adjusted by a method of mechanically cutting the fuse formed in parallel to the bleeder resistor with use of laser light or the like. The trimming of the bleeder resistor can accordingly be performed only before assembling a package. The use of a memory for trimming the bleeder resistor, on the other hand, enables electrical trimming even after the assembly. The following two typical benefits are obtained.

1. Users' requests for quick delivery can be accommodated because the trimming is carried out for the bleeder resistor in the package before shipment.

2. High precision can be achieved because the trimming covers package-related shift that occurs in assembling the package.

In general, once the bleeder resistor is trimmed, there is no need to alter information. As a trimming memory, an ultraviolet erasable, non-volatile erasable programmable read only memory (EPROM) is accordingly used as a one-time programmable (OTP) memory. Further, unlike a memory IC, the memory for trimming the bleeder resistor requires small memory capacity. As compared to the memory IC, high integration and high-speed operation of a memory cell are not required. Consequently, the typical challenges for the trimming memory include downsizing a peripheral circuit for controlling the memory, achieving lower voltage operation, and utilizing the existing manufacturing process.

As an ultraviolet erasable non-volatile EPROM, a non-volatile EPROM for writing information with use of hot carriers has hitherto been known. Particularly at present, the mainstream of the non-volatile memory for writing information with the use of hot carriers is an N-channel non-volatile EPROM. One of the reasons is that the N-channel non-volatile EPROM has a higher operating speed than a P-channel EPROM.

However, because the memory for trimming the bleeder resistor has small capacity and is not required to alter information once the information is written in trimming as described above, there is no problem even if the operating speed is lower than that of the memory IC. Further, in the P-channel EPROM, without applying such a high potential that causes avalanche breakdown between the substrate and the drain, drain avalanche hot electrons (DAHEs) are generated by applying a relatively low voltage and injected into a floating gate, to thereby change a threshold voltage and perform writing. Thus, it is considered that the P-channel non-volatile EPROM is more suitable for the memory for trimming the bleeder resistor.

The structure of a conventional P-channel non-volatile EPROM for writing information with the use of hot carriers is described below with reference to a cross-sectional view illustrated in FIG. 3.

In FIG. 3, an N-type well 8 is formed along one principal surface of a P-type semiconductor substrate 7 in which an element isolation region 9 is selectively formed. In the N-type well 8, impurities having P-type conductivity are heavily diffused to form a source region 10 and a drain region 11. On the substrate in which the source region 10 and the drain region 11 are formed, a floating gate 13 is formed through intermediation of a gate oxide film 12. On the floating gate 13, a control gate 15 is formed through intermediation of a second insulating film 14. The conventional non-volatile EPROM is configured in this way. The structure of electrode wiring and other members to be formed in subsequent processes (metal wiring and protective film) is the same as that in a commonly used semiconductor device, and hence its detailed description is omitted.

In the conventional non-volatile EPROM, it is said to be necessary to apply a high voltage to the drain and the control gate in writing in order to generate hot electrons to be injected into the floating gate. As described above for the challenges for the trimming memory, if the voltage in writing is high, the peripheral circuit needs to have a high withstand voltage, and the element structure becomes complicated in order to realize the high withstand voltage. As a result, there arise problems in that the area and the number of processes are increased. Accordingly, the operating voltage is required to be lower. If the write voltage is lowered, however, there is a problem in that the generation efficiency of hot carriers is reduced due to the low operating voltage so that a write period and an erase period become longer. Accordingly, write characteristics in the low voltage operation are required to be improved.

As means for improving the write characteristics, there is disclosed a technology for improving the write characteristics as follows. Irregularities are provided on an upper surface of the floating gate to increase the capacitance between the floating gate and the control gate and thereby increasing the potential of the floating gate (see, for example, Japanese Published Patent Application H05-55605).

However, when the method described in Japanese Published Patent Application H05-55605 is used to improve the write characteristics, the write characteristics can be improved for an N-channel EPROM and the method is effective, but the method is not effective for a P-channel EPROM.

Hitherto, in the case of the P-channel EPROM, similarly to the N-channel EPROM, a high voltage is applied to the drain and the control gate in writing (see, for example, Japanese Published Patent Application 2001-257324). However, because an optimum floating gate voltage for writing in the P-channel EPROM is set in the vicinity of a threshold of a memory element, the write characteristics cannot be improved even when the floating gate potential is increased in writing in the P-channel EPROM.

SUMMARY OF THE INVENTION

It is therefore an object of the present invention to provide a P-channel EPROM circuit capable of writing data at a low voltage with improved write characteristics.

In order to achieve the above-mentioned object, the present invention uses the following measures.

A resistor divider including two resistors, which is connected to a control gate of a P-channel EPROM, and two switch transistors connected in parallel to the two resistors are used to adjust a potential of the control gate so that a potential of a floating gate is set in a vicinity of a threshold of the memory element in writing.

With the above-mentioned method, in the P-channel non-volatile memory element, because the potential of the floating gate is set in the vicinity of the threshold of the memory element, the electric field between a pinch-off point and a drain becomes stronger so that hot carriers are more likely to be generated. Consequently, the write characteristics are improved, and writing can be performed at a low voltage.

According to one embodiment of the present invention, in the non-volatile memory circuit, the resistor divider including the two resistors and being connected to the control gate of the P-channel EPROM and the two switch transistors connected in parallel to the two resistors are used to adjust the potential of the control gate so that the potential of the floating gate is set in the vicinity of the threshold of the memory element in writing, permitting a realization of the non-volatile memory circuit capable of writing data at a low voltage with improved write characteristics.

BRIEF DESCRIPTION OF THE DRAWINGS

In the accompanying drawings:

FIG. 2 is a table showing a relationship of respective potentials in the non-volatile memory circuit according to the embodiment of the present invention.

DETAILED DESCRIPTION OF THE PREFERRED EMBODIMENT

An embodiment of the present invention is described in detail below.

Figure 1:
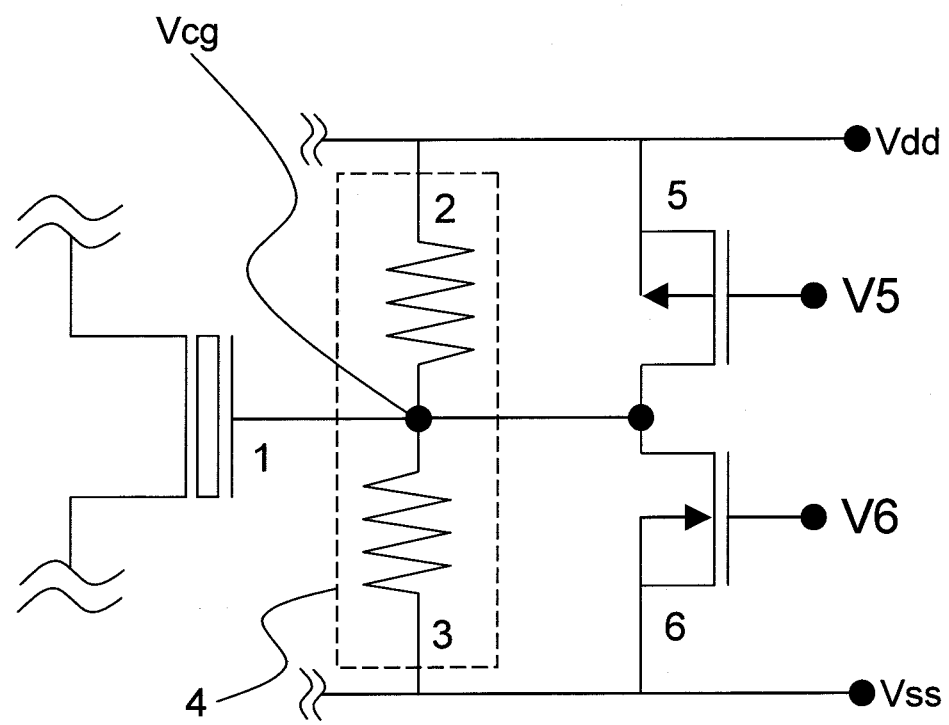
FIG. 1 is a schematic diagram illustrating an outline of a non-volatile memory circuit according to an embodiment of the present invention.
Figure 3:
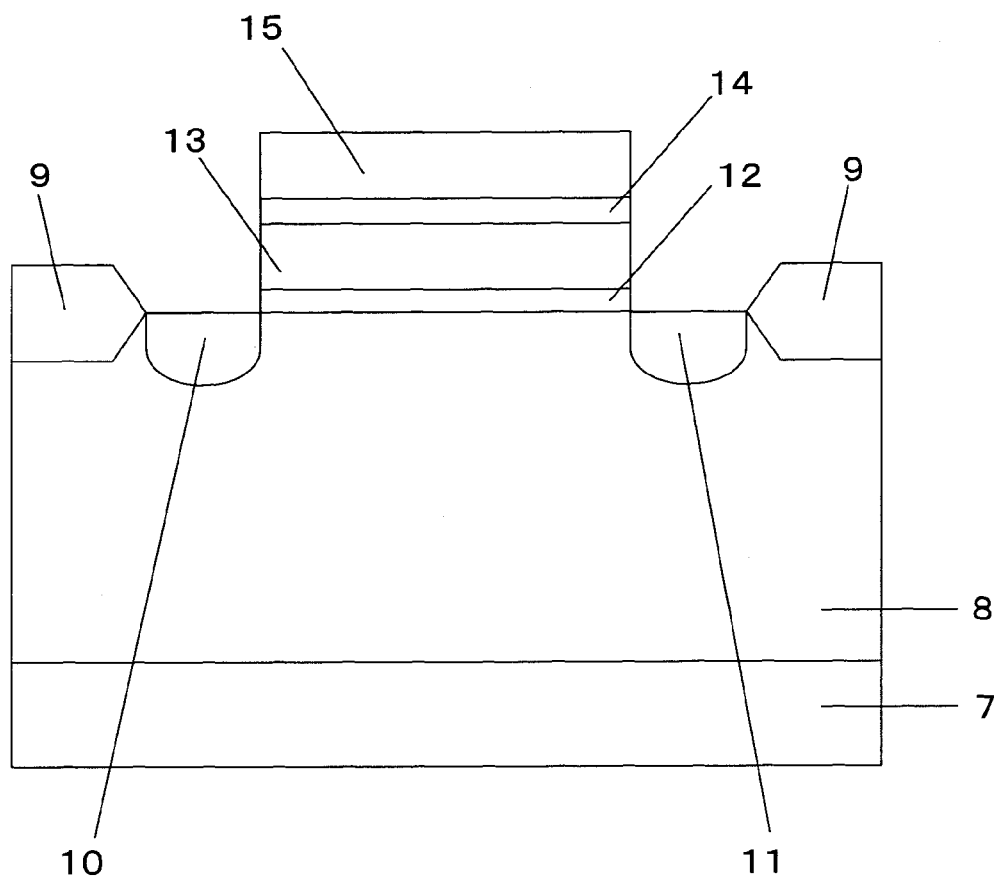
FIG. 3 is a cross-sectional view illustrating the structure of a conventional P-channel EPROM.

FIG. 1 is a non-volatile memory circuit illustrating an embodiment of the present invention. Referring to FIG. 1, the non-volatile memory circuit according to the present invention is described below.

In this embodiment, as illustrated in FIG. 1, a P-channel non-volatile memory element 1 includes a floating gate and a control gate capacitively coupled to the floating gate. The control gate is connected to a divided voltage output of a resistor divider 4 including a first resistor 2 and a second resistor 3 for dividing a voltage difference between a power supply voltage and a ground voltage, and is also connected to a P-channel switch transistor 5 connected in parallel to the first resistor 2 and an N-channel switch transistor 6 connected in parallel to the second resistor 3.

Next, a description is given of the operation of the non-volatile memory circuit according to this embodiment.

The resistance value of the first resistor 2 is represented by R2, and the resistance value of the second resistor 3 is represented by R3. The gate input potential of the P-channel switch transistor 5 is represented by V5, the gate input potential of the N-channel switch transistor 6 is represented by V6, and the potential of the control gate is represented by Vcg.

FIG. 2 shows the relationship of the respective potentials. In a writing mode, by setting the gate input potential V5 of the P-channel switch transistor to High and the gate input potential V6 of the N-channel switch transistor to Low and setting Vss to 0 V, Vdd is applied across the resistor divider.

Accordingly, the potential Vcg of the control gate is determined by a resistor division ratio of the resistance value R1 of the first resistor 2 and the resistance value R2 of the second resistor 3. The potential Vcg of the control gate in this case is expressed by Expression (1).

$$Vcg = Vdd \times \frac{R2}{R1 + R2} \quad (1)$$

The potential Vfg of the floating gate in this case is proportional to a capacitive coupling ratio (CR) of the memory element and is expressed by Expression (2).

$$Vfg = CR \times Vcg \quad (2)$$
$$= CR \times Vdd \times \frac{R2}{R1 + R2}$$

The P-channel non-volatile memory element 1 has the condition that the electric field between a pinch-off point and the drain becomes strongest to generate hot carriers most when the potential of the floating gate is set in the vicinity of a threshold voltage in an ultraviolet-erased state. Accordingly, the resistance value R1 and the resistance value R2 are set so that the potential Vfg of the floating gate expressed in Expression (2) is set in the vicinity of the threshold voltage in the ultraviolet-erased state. By adjusting the potential Vfg of the floating gate to the vicinity of the threshold voltage in the ultraviolet-erased state, the write characteristics are improved.

Next, in a reading mode and in a retention mode (a state in which power supply is turned on but writing or reading is not performed), the gate input potential V5 of the P-channel switch transistor is controlled to Low and the gate input potential V6 of the N-channel switch transistor is controlled to Low. Then, the potential Vcg of the control gate of the P-channel non-volatile memory element becomes Vdd. Consequently, the determination of "1" or "0" can be made similarly to the conventional P-channel non-volatile memory element.

It is preferred that capacitive coupling ratio (CR) be large in consideration of erroneous write characteristics in the retention mode, but no particular limitation is imposed because CR is not directly related to this embodiment.

Although the switch transistors in this embodiment are the P-channel switch transistor 5 and the N-channel switch transistor 6, another means may be used as long as a similar potential relationship can be established.

The largest feature of this embodiment resides in that the control gate potential Vcg and the floating gate potential Vfg of the P-channel non-volatile memory element are controlled by the resistor divider and the switch transistors connected in parallel to the resistor divider. Accordingly, no limitation is imposed on the detailed operation and configuration of the circuits other than those described in this embodiment.

The description of the non-volatile memory circuit according to this embodiment is completed.

From this embodiment described above, the following effects can be obtained.

The resistor divider including two resistors, which is connected to the control gate of the P-channel non-volatile memory element, and the two switch transistors connected in parallel to the two resistors of the resistor divider are adjusted so that the potential Vfg of the floating gate of the P-channel non-volatile memory element is set in the vicinity of the threshold voltage of the P-channel non-volatile memory element, which satisfies the condition that the electric field between the pinch-off point and the drain becomes strongest to generate hot carriers most in the P-channel non-volatile memory element, thus improving the write characteristics. Consequently, the non-volatile memory circuit capable of writing data at a low voltage can be provided.

What is claimed is:

1. A non-volatile memory circuit formed of a P-channel MOS transistor, comprising:

a P-channel non-volatile memory element comprising a floating gate and a control gate capacitively coupled to the floating gate;

a resistor divider comprising a first resistor and a second resistor for dividing a voltage difference between a power supply voltage and a ground voltage, a divided voltage output of the resistor divider being connected to the control gate of the P-channel non-volatile memory element;

a first switch connected in parallel to the first resistor; and a second switch connected in parallel to the second resistor, wherein the first switch and the second switch are controlled so that a voltage of the control gate is set to a voltage of the divided voltage output which maximizes an electric field between a pinch-off point and a drain point of the P-channel MOS transistor in a writing mode, and so that the voltage of the control gate is set to the power supply voltage in a reading mode and in a retention mode.

2. A non-volatile memory circuit according to claim 1, wherein a resistance value of the first resistor and a resistance value of the second resistor are selected so that the voltage applied to the control gate in the writing mode is set in a vicinity of a threshold of the non-volatile memory element in an ultraviolet-erased state.

3. A non-volatile memory circuit formed of a P-channel MOS transistor, comprising:

a P-channel non-volatile memory element having a floating gate and a control gate capacitively coupled to the floating gate; and resistors connected in parallel to respective switch transistors for adjusting a potential of the control gate so that a potential of the floating gate of the P-channel non-volatile memory element is set in a vicinity of a threshold of the P-channel non-volatile memory element to maximize an electric field between a pinch-off point and a drain of the P-channel non-volatile memory element in a writing mode, the resistors being connected to the control gate.

4. A non-volatile memory circuit according to claim 3, wherein the control gate of the P-channel non-volatile memory element is connected to a divided voltage output of the resistors.

5. A non-volatile memory circuit according to claim 4, wherein the resistors comprises a first resistor and a second resistor for dividing a voltage difference between a power supply voltage and a ground voltage; and wherein the switch transistors comprises a first switch transistor connected in parallel to the first resistor and a second switch transistor connected in parallel to the second resistor.

6. A non-volatile memory circuit according to claim 5, wherein a resistance value of the first resistor and a resistance value of the second resistor are selected so that a voltage applied to the control gate in the writing mode is set in a vicinity of a threshold of the non-volatile memory element in an ultraviolet-erased state.

7. A non-volatile memory circuit according to claim 4, wherein the control gate of the P-channel non-volatile memory element is connected to the switch transistors.

8. A P-channel EPROM circuit comprising:

a P-channel non-volatile memory element having a floating gate and a control gate capacitively coupled to the floating gate;

a resistor divider having a divided voltage output connected to the control gate; and switch transistors connected to the resistor divider for controlling a potential of the control gate and a potential of the floating gate so that the potential of the floating gate is adjusted to a vicinity of a threshold of the P-channel non-volatile memory element in an ultraviolet-erased state to maximize an electric field between a pinch-off point and a drain of the P-channel non-volatile memory element in a writing mode.

9. A P-channel EPROM circuit according to claim 8, wherein the resistor divider comprises a first resistor and a second resistor; and wherein the switch transistors comprises a first switch transistor connected in parallel to the first resistor and a second switch transistor connected in parallel to the second resistor.

* * * * *